US012754262B2

(12) United States Patent
Nakayama

(10) Patent No.: US 12,754,262 B2
(45) Date of Patent: Oct. 6, 2026

(54) MAGNETIC RESONANCE IMAGING APPARATUS AND OPERATION METHOD OF MAGNETIC RESONANCE IMAGING APPARATUS

(71) Applicant: FUJIFILM Healthcare Corporation, Chiba (JP)

(72) Inventor: Takeshi Nakayama, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 151 days.

(21) Appl. No.: 18/759,973

(22) Filed: Jun. 30, 2024

(65) Prior Publication Data

US 2025/0012878 A1 Jan. 9, 2025

(30) Foreign Application Priority Data

Jul. 5, 2023 (JP) ................................ 2023-110633

(51) Int. Cl.
*G01V 3/00* (2006.01)
*G01R 33/28* (2006.01)

(52) U.S. Cl.
CPC .................................. *G01R 33/288* (2013.01)

(58) Field of Classification Search
CPC .................................................... G01R 33/288
USPC .......................................................... 324/309
See application file for complete search history.

(56) References Cited

U.S. PATENT DOCUMENTS 10,488,473 B2 11/2019 Leussler et al.
10,788,548 B2 9/2020 Findeklee et al.
2013/0279779 A1* 10/2013 Darrow ................. A61B 5/055 382/131
2016/0131727 A1* 5/2016 Sacolick ............. G01R 33/445 324/318

FOREIGN PATENT DOCUMENTS

| | | | | | |
|---|---|---|---|---|---|
| CN | 104756205 A | * | 7/2015 | | H01F 6/02 |
| EP | 3363357 A1 | * | 8/2018 | | A61B 5/055 |
| JP | 2007289670 | | 11/2007 | | |
| JP | 2017113410 A | * | 6/2017 | | |
| JP | 2017536864 | | 12/2017 | | |
| JP | 6684832 | | 4/2020 | | |
| WO | WO-2006049753 A1 | * | 5/2006 | | A61L 29/18 |
| WO | WO-2020088959 A1 | * | 5/2020 | | H02H 7/001 |

* cited by examiner

*Primary Examiner* — Walter L Lindsay, Jr.
*Assistant Examiner* — Frederick Wenderoth
(74) *Attorney, Agent, or Firm* — JCIPRNET

(57) ABSTRACT

The magnetic resonance imaging apparatus includes: a high-frequency coil; a gradient magnetic field generation coil; a static magnetic field generation coil which is a superconducting coil having an inductance larger than an inductance of the high-frequency coil and an inductance of the gradient magnetic field generation coil; an energization controller that energizes the static magnetic field generation coil; a voltage measurement unit that measures a voltage between current lead terminals of the static magnetic field generation coil; and a magnetic material detection unit that detects a magnetic material existing in an imaging space of the magnetic resonance imaging apparatus and a magnetic material existing in a vicinity of the imaging space based on a first voltage that is a voltage measured in a state where the static magnetic field generation coil is energized with a first current less than a rated current in capturing the magnetic resonance image.

9 Claims, 6 Drawing Sheets

MAGNETIC RESONANCE IMAGING APPARATUS AND OPERATION METHOD OF MAGNETIC RESONANCE IMAGING APPARATUS

CROSS-REFERENCE TO RELATED APPLICATION

The present application claims priority under 35 U.S.C § 119 (a) to Japanese Patent Application No. 2023-110633 filed on Jul. 5, 2023, which is hereby expressly incorporated by reference, in its entirety, into the present application.

BACKGROUND OF THE INVENTION

1. Field of the Invention

The present invention relates to a magnetic resonance imaging apparatus and an operation method of a magnetic resonance imaging apparatus, and particularly relates to a technique of detecting a magnetic material existing in an imaging space of the magnetic resonance imaging apparatus and a vicinity of the imaging space.

2. Description of the Related Art

A magnetic resonance imaging apparatus (MRI apparatus) has a property that an image is disturbed in the existence of a magnetic material. Therefore, a technique of detecting or detecting a magnetic material existing near the MRI apparatus is used. For example, JP2017-536864A describes that a change in electrical data of a gradient magnetic field coil provided in an MRI apparatus is detected to detect a metal, and JP6684832B describes that a metal is detected by using a wireless frequency antenna device (high-frequency coil) provided in an MRI apparatus. In addition, JP2007-289670A describes that a magnetic field is generated by a coil for magnetic material detection provided separately from an MRI apparatus to determine the presence or absence of an approach of a magnetic material.

SUMMARY OF THE INVENTION

In a case in which the magnetic material is detected by the change in the electrical data (for example, a voltage) of the coil, the change in the voltage of the coil is proportional to the inductance, but the inductance of a gradient magnetic field coil or a high-frequency coil of the MRI apparatus is small, and the change in the voltage caused by the magnetic material is small, so that the magnetic material cannot be accurately detected by the techniques of JP2017-536864A and JP6684832B. In addition, the configuration in which a magnetic material detection device is provided separately from the MRI apparatus as in JP2007-289670A causes the system configuration to be complicated or large.

As described above, in the related art, the magnetic material existing in the imaging space of the MRI apparatus and the vicinity of the imaging space cannot be accurately detected with a simple configuration.

The present invention has been made in view of such circumstances, and an object of the present invention is to provide a magnetic resonance imaging apparatus and an operation method of a magnetic resonance imaging apparatus that can detect a magnetic material existing in an imaging space and a vicinity of the imaging space with high accuracy by a simple configuration.

In order to achieve the above-described object, a first aspect of the present invention provides a magnetic resonance imaging apparatus that captures a magnetic resonance image of a subject, the magnetic resonance imaging apparatus comprising: a high-frequency coil; a gradient magnetic field generation coil; a static magnetic field generation coil that has an inductance larger than an inductance of the high-frequency coil and an inductance of the gradient magnetic field generation coil, the static magnetic field generation coil being a superconducting coil; an energization controller that energizes the static magnetic field generation coil; a voltage measurement unit that measures a voltage between current lead terminals of the static magnetic field generation coil; and a magnetic material detection unit that detects a magnetic material existing in an imaging space of the magnetic resonance imaging apparatus and a magnetic material existing in a vicinity of the imaging space based on a first voltage that is a voltage measured in a state in which the static magnetic field generation coil is energized with a first current less than a rated current in a case of capturing the magnetic resonance image.

According to the first aspect, the static magnetic field generation coil that has the inductance larger than the inductance of the high-frequency coil and the inductance of the gradient magnetic field generation coil and that is the superconducting coil is used, so that a change in the voltage caused by the existence of the magnetic material is large even in a state in which the energization with the first current less than the rated current is performed, and the magnetic material existing in the imaging space and the magnetic material existing in the vicinity of the imaging space can be accurately detected. It should be noted that the superconducting coil is also referred to as a superconductive coil. Since the static magnetic field generation coil provided in the magnetic resonance imaging apparatus is used, it is not necessary to provide another imaging apparatus for the magnetic material detection, and the configuration of the device can be simplified. It should be noted that the "existence" of the magnetic material includes a case in which the magnetic material or the subject having the magnetic material moves and enters the imaging space or a vicinity of the imaging space (the same applies to the followering aspects). The "imaging space" is a space in which the subject is located in a case in which the magnetic resonance image is captured, and is, for example, an inside of a tunnel in a case of a tunnel bore type apparatus. It should be noted that, in the first aspect, the "energization" means to apply energy to the superconducting coil in a cooling state (superconducting state) from the outside by connecting an electromagnetic induction or a power source. In addition, the high-frequency coil is also referred to as a radio frequency (RF) coil.

In the first aspect and each of the following aspects, for example, an instrument or a machine used in the vicinity of the magnetic resonance imaging apparatus, or an article worn by the subject or a user (including a pacemaker, an artificial joint, or the like in the subject or the body of the user) can be regarded as a detection target magnetic material.

A second aspect provides the magnetic resonance imaging apparatus according to the first aspect, in which the magnetic material detection unit determines that the magnetic material is detected, in a case in which at least one of a case in which the first voltage is equal to or larger than a threshold value or a case in which a temporal change rate of the first voltage is equal to or larger than a reference value is satisfied. The second aspect defines that it is determined that "the magnetic material that affects the imaging existence" in a predetermined case.

A third aspect provides the magnetic resonance imaging apparatus according to the second aspect, in which the energization controller energizes the static magnetic field generation coil with the rated current in a case in which the first voltage is less than the threshold value and the temporal change rate of the first voltage is less than the reference value. In the third aspect, in a case in which the first voltage is less than the threshold value and the temporal change rate of the first voltage is less than the reference value, it is possible to determine that "the magnetic material that affects the imaging does not exist in the imaging space and the vicinity of the imaging space", and the energization controller energizes the static magnetic field generation coil with the rated current to enable capturing the magnetic resonance image.

A fourth aspect provides the magnetic resonance imaging apparatus according to any one of the first to third aspects, in which, in a case in which the magnetic material is detected, the magnetic material detection unit one or more of stopping energizing the static magnetic field generation coil, stopping moving the subject to the imaging space, or giving a notification that the magnetic material is detected. The fourth aspect defines a response in a case in which it is determined that "the magnetic material that affects the imaging exists", and it is possible to prevent the image from being disturbed due to the influence of the magnetic material by these responses. It should be noted that the notification can be performed by display on a display device, the audio emission, or the like.

A fifth aspect provides the magnetic resonance imaging apparatus according to any one of the first to fourth aspects, in which the energization controller starts the energization with the first current before the subject is moved to the imaging space. According to the fifth aspect, the magnetic material can be detected before the subject is moved to the imaging space.

A sixth aspect provides the magnetic resonance imaging apparatus according to any one of the first to fifth aspects, further comprising: an information output unit that outputs information indicating whether or not the magnetic material exists. The information output unit may directly output "whether or not the magnetic material exists" in characters or voice, or may output information (applied current or measured voltage) indirectly indicating "whether or not the magnetic material exists" in characters, numbers, graphs, or the like.

A seventh aspect provides the magnetic resonance imaging apparatus according to any one of the first to sixth aspects, further comprising: an operation unit that receives an operation of instructing the energization controller to perform the energization with the first current.

An eighth aspect provides the magnetic resonance imaging apparatus according to any one of the first to seventh aspects, in which the magnetic material is a metal.

In order to achieve the above-described object, a ninth aspect of the present invention provides an operation method of a magnetic resonance imaging apparatus that captures a magnetic resonance image of a subject and includes a high-frequency coil, a gradient magnetic field generation coil, a static magnetic field generation coil that has an inductance larger than an inductance of the high-frequency coil and an inductance of the gradient magnetic field generation coil, the static magnetic field generation coil being a superconducting coil, and a processor, the operation method comprising: via the processor, energizing the static magnetic field generation coil; measuring a voltage between current lead terminals of the static magnetic field generation coil; and detecting a magnetic material existing in an imaging space of the magnetic resonance imaging apparatus and a magnetic material existing in a vicinity of the imaging space based on a first voltage that is a voltage measured in a state in which the static magnetic field generation coil is energized with a first current less than a rated current in a case of capturing the magnetic resonance image. According to the tenth aspect, as in the first aspect, the magnetic material existing in the imaging space and the vicinity of the imaging space can be accurately detected with a simple configuration. It should be noted that the operation method according to the ninth aspect may further have a configurations corresponding to the second to eighth aspects.

As described above, with the magnetic resonance imaging apparatus and the operation method of the magnetic resonance imaging apparatus according to the aspects of the present invention, the magnetic material existing in the imaging space and the vicinity of the imaging space can be accurately detected with a simple configuration.

DESCRIPTION OF THE PREFERRED EMBODIMENTS

Hereinafter, preferred embodiments of a magnetic resonance imaging apparatus and an operation method of a magnetic resonance imaging apparatus according to an embodiment of the present invention will be described with reference to the accompanying drawings. It should be noted that, in the accompanying drawings, some components are not shown for convenience of description in some cases. In addition, the accompanying drawings do not show accurate shapes and dimensions of the magnetic resonance imaging apparatus.

First Embodiment

Configuration of Magnetic Resonance Imaging Apparatus

Figure 1:
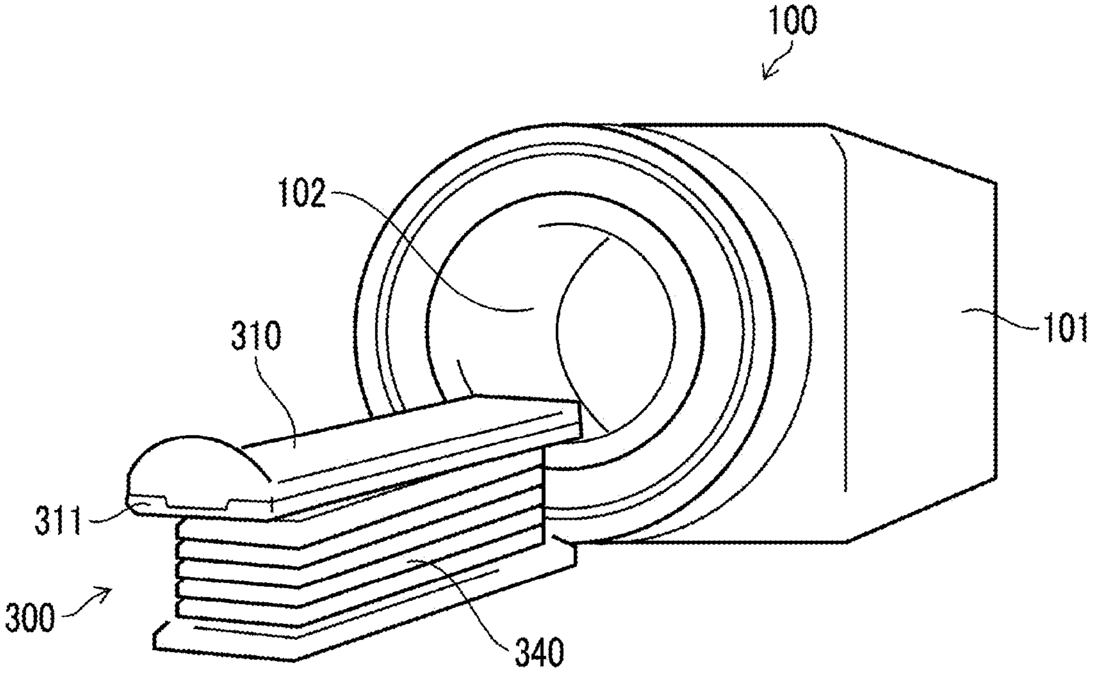
FIG. 1 is a view showing a configuration of a magnetic resonance imaging system.

First, a configuration of the magnetic resonance imaging apparatus will be described. As shown in FIG. 1, a magnetic resonance imaging apparatus 100 according to a first embodiment comprises an apparatus body 101 and an examination table device 300.

The magnetic resonance imaging apparatus 100 is an apparatus that obtains a tomographic image of a subject 110 (see FIG. 2), and in the present embodiment, the magnetic resonance imaging apparatus 100 is a magnetic resonance imaging (MRI) apparatus using a nuclear magnetic resonance (NMR) phenomenon. In FIG. 1, as an example of the magnetic resonance imaging apparatus 100 and the apparatus body 101, a tunnel bore type MRI apparatus comprising a cylindrical gantry is shown. The apparatus body 101 has a cylindrical tunnel 102 of which an axial direction is horizontal, and generates a static magnetic field in the tunnel 102 to form an imaging space. The apparatus body 101 is disposed in an electromagnetically shielded room, and the gradient magnetic field power source 132, the sequencer 140, a high-frequency oscillator 151, a modulator 152, a high-frequency amplifier 153, a signal amplifier 162, a quadrature phase detector 163, an A/D converter 164, a controller 170, and the like (see FIG. 2) are disposed outside the electromagnetically shielded room and are electrically connected to the apparatus body 101 through a cable.

Configuration of Magnetic Resonance Imaging Apparatus

Figure 2:
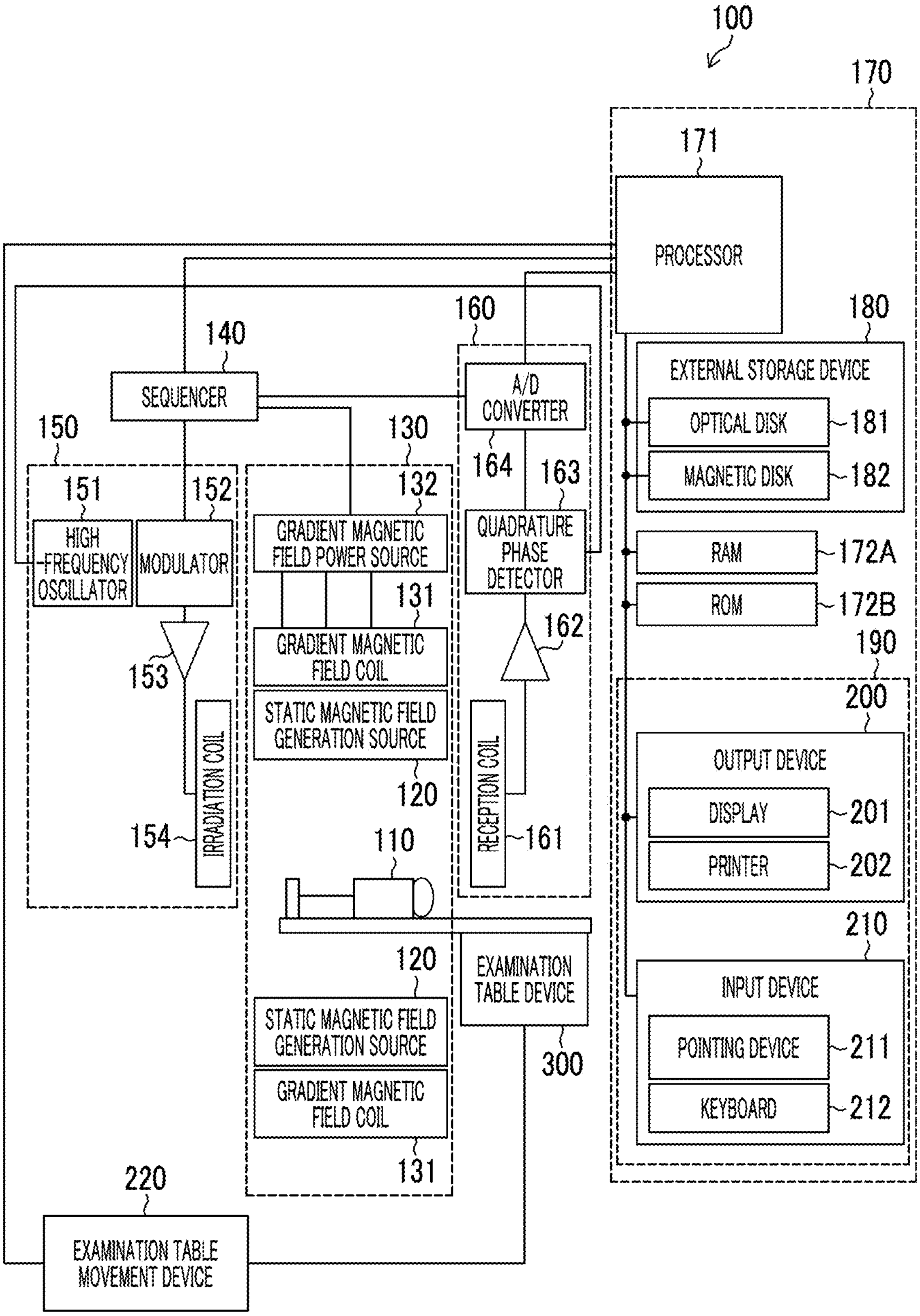
FIG. 2 is a view showing a configuration of a magnetic resonance imaging apparatus.

FIG. 2 is a view showing a configuration of the magnetic resonance imaging apparatus 100. As shown in FIG. 2, the magnetic resonance imaging apparatus 100 comprises a static magnetic field generation source 120, a gradient magnetic field generation unit 130, a sequencer 140, a high-frequency irradiation unit 150, a signal detection unit 160, and a controller 170.

Figure 3:
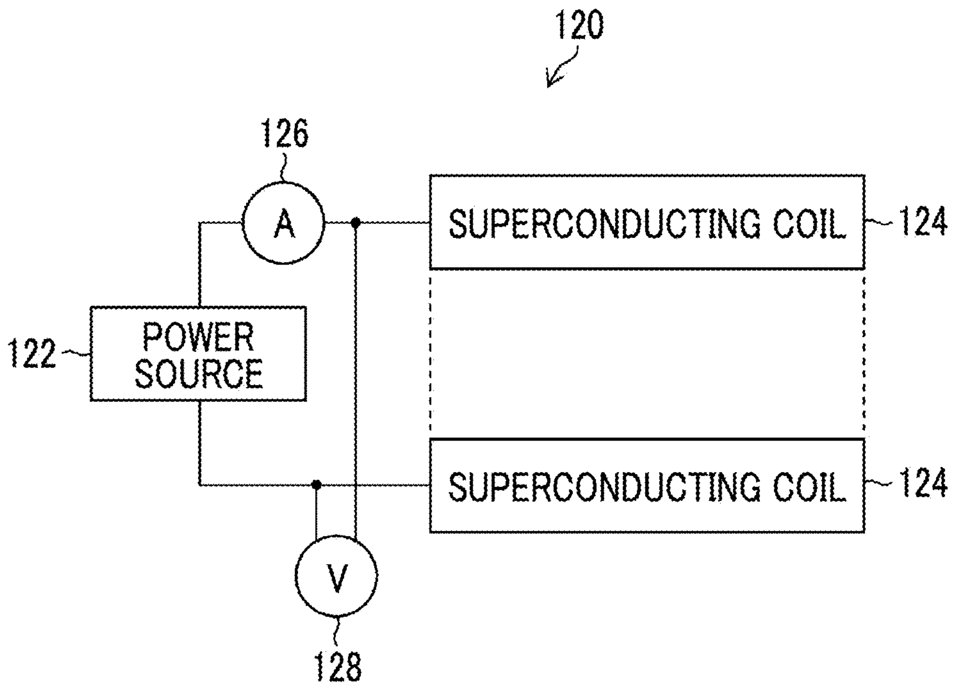
FIG. 3 is a view showing a configuration of a static magnetic field generation source.
Figure 4:
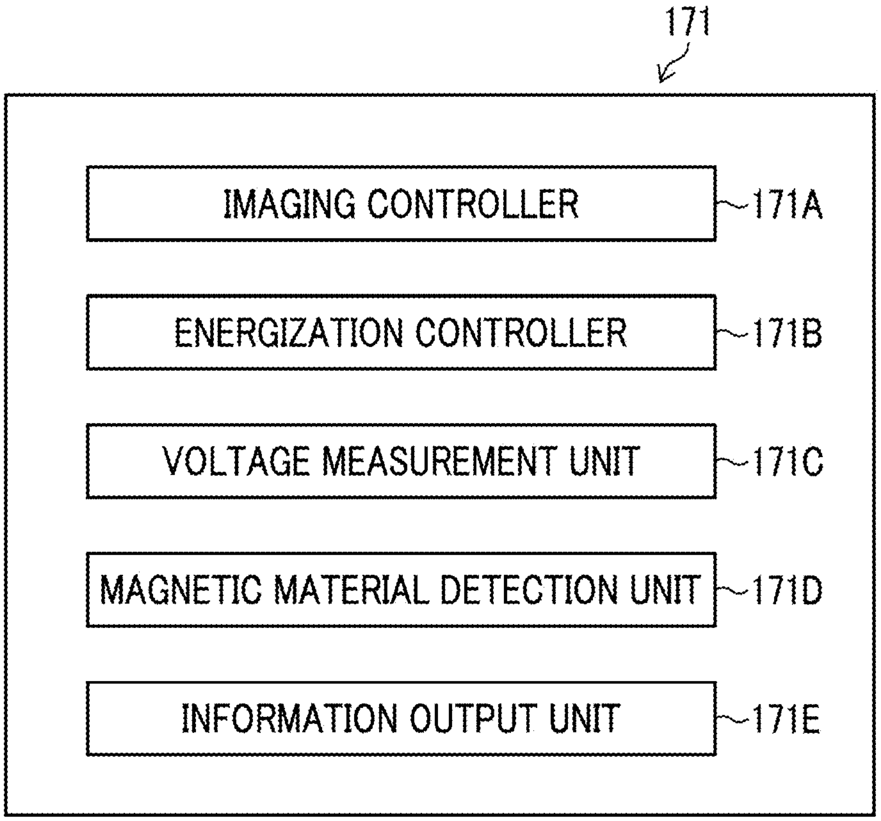
FIG. 4 is a view showing a functional configuration of a processor.

As shown in FIG. 3, the static magnetic field generation source 120 comprises a power source 122 and a superconducting coil 124 (static magnetic field generation coil), and generates a uniform static magnetic field in a static magnetic field space accommodating the subject 110 in a direction orthogonal to a body axis of the subject 110 in a case of a vertical magnetic field method, or in a direction of the body axis of the subject 110 in a case of a horizontal magnetic field method. The static magnetic field generation source 120 is disposed in the vicinity of the subject 110. A current and a voltage of the superconducting coil 124 are measured by an ammeter 126 and a voltmeter 128, and are input to a processor 171 (controller 170). It should be noted that the static magnetic field generation coil may be a normal conductive coil instead of the superconducting coil.

Returning to FIG. 2, the gradient magnetic field generation unit 130 includes gradient magnetic field coils 131 that generate gradient magnetic fields in three axial directions of X, Y, and Z, which are a coordinate system (stationary coordinate system) of the magnetic resonance imaging apparatus 100, and a gradient magnetic field power source 132 that drives each of the gradient magnetic field coils 131 (gradient magnetic field generation coil), in a superimposed manner in the static magnetic field space. Gradient magnetic fields Gx, Gy, and Gz are generated in the three axial directions X, Y, and Z by driving the gradient magnetic field power source 132 of each coil in response to a command, that is, control from the sequencer 140 described below. In the imaging, a slice direction gradient magnetic field pulse (Gs) is applied in a direction orthogonal to a slice plane (imaging cross section) to set the slice plane with respect to the subject 110, and a phase encoding direction gradient magnetic field pulse (Gp) and a frequency encoding direction gradient magnetic field pulse (Gf) are applied in the remaining two directions orthogonal to the slice plane and orthogonal to each other, to encode position information in each direction in an echo signal.

The sequencer 140 repeatedly applies a high-frequency magnetic field pulse (RF pulse) and a gradient magnetic field pulse in a predetermined pulse sequence. The sequencer 140 operates based on the control of the processor 171 and transmits various commands, that is, controls required for data collection of the tomographic image of the subject 110 to the gradient magnetic field generation unit 130, the high-frequency irradiation unit 150, and the signal detection unit 160.

The high-frequency irradiation unit 150 irradiates the subject 110 with the RF pulse in order to cause nuclear magnetic resonance in the atomic nucleus spin of the atom constituting the biological tissue of the subject 110. The high-frequency irradiation unit 150 includes the high-frequency oscillator 151, the modulator 152, the high-frequency amplifier 153, and an irradiation coil 154 (high-frequency coil) which is a high-frequency coil on the transmission side. The subject 110 is irradiated with the electromagnetic waves by amplitude-modulating the RF pulse output from the high-frequency oscillator 151 via the modulator 152 at a timing based on the command from the sequencer 140, amplifying the amplitude-modulated RF pulse via the high-frequency amplifier 153, and then supplying the amplified RF pulse to the irradiation coil 154 disposed near the subject 110.

The signal detection unit 160 detects the echo signal, which is an NMR signal released by the nuclear magnetic resonance of the nuclear spin constituting the biological tissue of the subject 110. The signal detection unit 160 includes a reception coil 161 (high-frequency coil), which is a high-frequency coil on a reception side, the signal amplifier 162, the quadrature phase detector 163, and the analog/digital converter (A/D converter) 164. The NMR signal of the response induced in the subject 110 by the electromagnetic waves applied from the irradiation coil 154 is detected by the reception coil 161 disposed near the subject 110, amplified by the signal amplifier 162, and then divided into signals of two systems orthogonal to each other by the quadrature phase detector 163 at the timing of the command from the sequencer 140, and each of the signals is converted into a digital amount by the A/D converter 164 and is transmitted to the controller 170.

The controller 170 (processor) performs various types of data processing, and displays and stores the processing results. The controller 170 includes the processor 171 (processor), a storage device such as a random access memory (RAM) 172A and a read only memory (ROM) 172B, an external storage device 180 such as an optical disk 181 and a magnetic disk 182, and an input/output unit 190. In a case in which the signal detection unit 160 receives the signal or the data, the processor 171 executes processing such as signal processing and image reconstruction by using the RAM 172A as a work area, displays the tomographic image of the subject 110, which is the result thereof, on an output device 200, and records the tomographic image in the external storage device 180. In a case in which the processor 171 executes these types of processing, the processor 171 can refer to a program or data recorded on the ROM 172B.

Under the control of the processor 171, the controller 170 can energize the superconducting coil 124 (static magnetic field generation coil) from the power source 122, and measure the applied current and the voltage between current lead terminals of the superconducting coil 124 by using the ammeter 126 and the voltmeter 128. In addition, the controller 170 (processor 171) detects a magnetic material based on these measurement results, and outputs the result.

As described above, the processor 171 operates as an imaging controller 171A, an energization controller 171B (energization controller), a voltage measurement unit 171C (voltage measurement unit), a magnetic material detection unit 171D (magnetic material detection unit), and an information output unit 171E (information output unit) (see FIG.

4). The detection of the magnetic material via each of these units will be described in detail below.

The input/output unit 190 performs input and output of various types of control information of the magnetic resonance imaging apparatus 100 and control information of the processing performed by the controller 170, specifically, performs input reception and display of imaging parameters of the pulse sequence and the like. In addition, the input/output unit 190 receives an operation of giving an instruction to energize the static magnetic field generation coil (with a first current or the like), and outputs information indicating an energization state, the measured voltage, or the like. The input/output unit 190 consists of, for example, an input device 210 (operation unit) including a pointing device 211 such as a trackball, a mouse, a pad, or a touch panel, and a keyboard 212, and an output device 200 (information output unit) including a display 201 such as a cathode-ray tube (CRT) or a liquid crystal display (LCD), and a printer 202. The input device 210 may be disposed near the output device 200, and may be interactively controlled, for example, by an operator while viewing the display 201 to give an instruction to execute various types of processing on the magnetic resonance imaging apparatus 100 via the pointing device 211. In addition, the touch panel that operates as the input device 210 may be disposed on a display surface of the display 201, and the input operation may be performed by selecting or operating the display content of the display 201.

In addition, the input/output unit 190 may comprise an audio input/output device such as a microphone or a speaker, and with these devices, the operator may perform the operation using the audio through the microphone, or may perform the indication of the information of the energization state or the measured voltage, or the notification in a case in which the magnetic material is detected (for example, one or more of stopping energizing the static magnetic field generation coil, stopping moving the subject into the imaging space, and giving a notification that the magnetic material is detected) by using the audio.

The subject 110 is placed on a top plate 310 of the examination table device 300, and is accommodated in the static magnetic field space, which is the imaging space, by an examination table movement device 220 (see FIG. 2). The irradiation coil 154 on the transmission side and the gradient magnetic field coil 131 are installed in the static magnetic field space in which the subject 110 is accommodated, to face the subject 110 in a case of the vertical magnetic field method and to surround the subject 110 in a case of the horizontal magnetic field method. In addition, the reception coil 161 on the reception side is installed to face an imaging target part of the subject 110 or to surround the imaging target part.

It should be noted that, as the imaging target nuclide of the current MRI apparatus, a hydrogen atom nucleus (proton), which is the main constituent substance of the subject 110, is widely used in clinical practice. By visualizing information on a spatial distribution of a proton density or a spatial distribution of a relaxation time of an excited state, a morphology or a function of a human body, such as a head, an abdomen, and limbs, is imaged two-dimensionally or three-dimensionally.

Examples of Inductance of Coil and Voltage to be Generated

As described above, the magnetic resonance imaging apparatus 100 comprises the irradiation coil 154 and the reception coil 161 (high-frequency coils), the gradient magnetic field coil 131 (gradient magnetic field generation coil), and the superconducting coil 124 (static magnetic field generation coil). In a case in which examples of inductances of the coils and the voltages generated in the coils in a case in which the magnetic material moves are shown, the inductances of the high-frequency coil, the gradient magnetic field generation coil, and the static magnetic field generation coil are 1 μH (H: Henry), 1 mH, and 30 H, respectively, and the generated voltages (relative values) are 0.001, 1, and 30000, respectively. In a case in which the static magnetic field generation coil is the superconducting coil, the superconducting coil has a large inductance because the superconducting coil is wound around a superconducting wire by, for example, about several thousand turns. As described above, since the static magnetic field generation coil has a large inductance, the voltage generated by the magnetic material is also high, so that the magnetic material is suitably detected.

Configuration of Examination Table Device

The examination table device 300 includes the top plate 310 on which the subject 110 is placed, a top plate holding unit 311, and a body part 340. It should be noted that, although the aspect has been described in the first embodiment in which the examination table device 300 is fixed to the apparatus body 101, the examination table device 300 may be configured separately from the magnetic resonance imaging apparatus 100 so as to be connected to and separated from the apparatus body 101. The top plate 310 is held by the top plate holding unit 311 and is slidable to the inside or the outside of the imaging space via the examination table movement device 220 (see FIG. 2) in the magnetic resonance imaging apparatus 100. In addition, the examination table device 300 comprises a top plate locking mechanism (not shown), and the top plate locking mechanism can lock the top plate 310 to make the top plate 310 unable to slide, or can release the locking of the top plate 310 to make the top plate 310 slidable. It should be noted that the examination table device 300 comprises a top plate raising and lowering mechanism (not shown) (for example, a hydraulic jack or a pantograph arm) and can raise and lower the top plate 310 and the top plate holding unit 311.

Detection of Magnetic Material

Figures 5A, 5B, 5C, 5D:
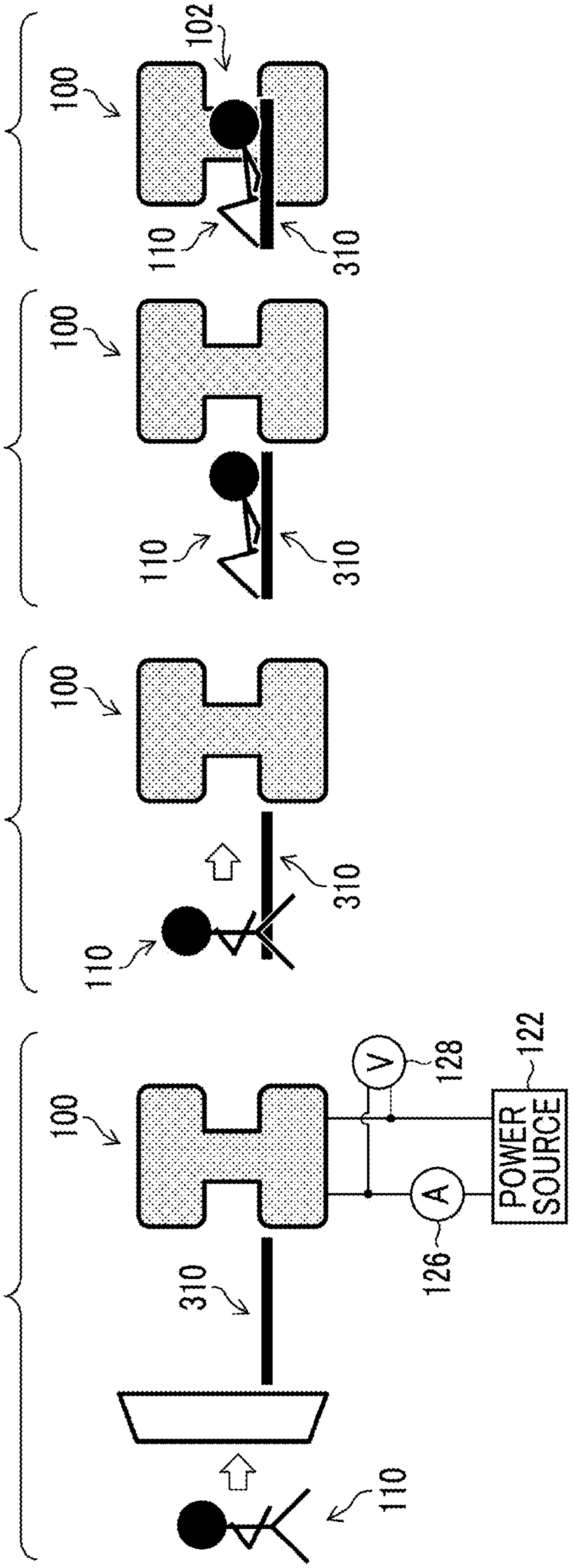
FIGS. 5A to 5D are schematic views showing a state of magnetic material detection.
Figure 6A:
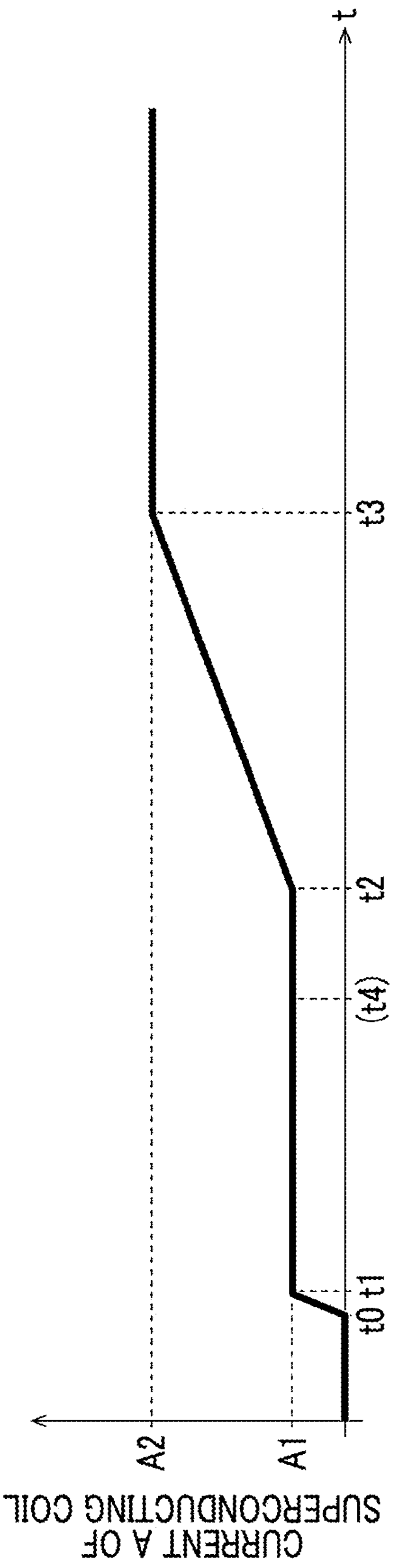
FIGS. 6A and 6B are views showing a current and a voltage of a static magnetic field generation coil (in a case in which a magnetic material does not exist).
Figure 6B:
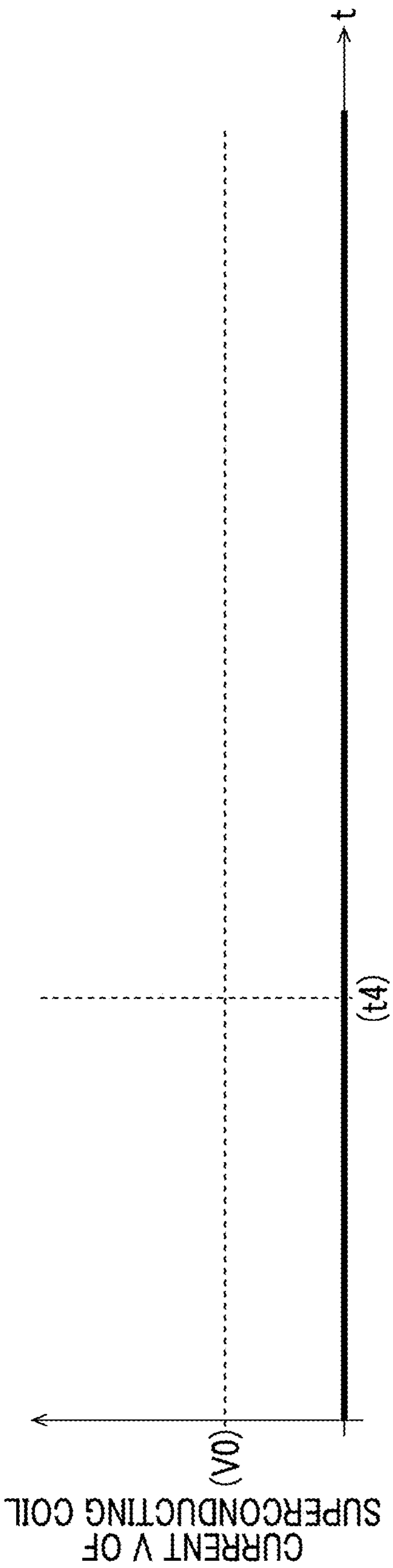
Figure 7A:
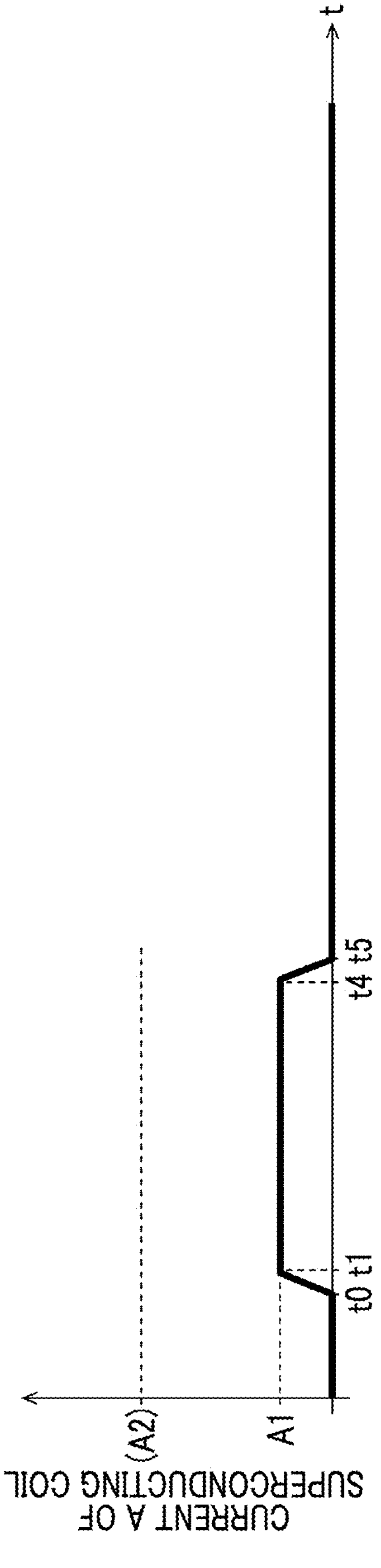
FIGS. 7A and 7B are views showing a current and a voltage of the static magnetic field generation coil (in a case in which the magnetic material exists).
Figure 7B:
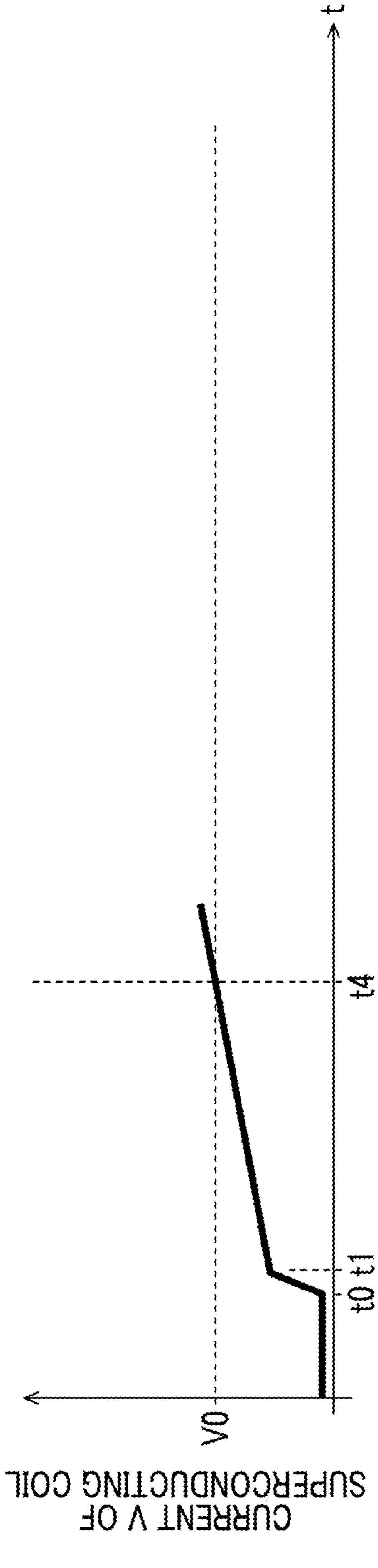

Hereinafter, the detection of the magnetic material in the imaging space of the magnetic resonance imaging apparatus 100 and in the vicinity of the imaging space will be described. FIGS. 5A to 5D are schematic views (showing only some components) showing a state of the detection of the magnetic material, FIGS. 6A and 6B are views showing the current and the voltage of the superconducting coil 124 (static magnetic field generation coil) in a case in which the magnetic material does not exist in the imaging space and the vicinity of the imaging space, and FIGS. 7A and 7B are views showing the current and the voltage of the superconducting coil 124 in a case in which the magnetic material exists in the imaging space or the vicinity of the imaging space. It should be noted that the information output unit 171E (processor 171; information output unit) can display the graphs shown in FIGS. 6A to 7B, the values of the current and the voltage, whether or not the magnetic material exists, or the like on the display 201.

First, a case will be described in which the magnetic material does not exist in the imaging space and the vicinity of the imaging space. FIG. 5A shows a state in which the subject 110 enters a space (examination room or the like) in which the magnetic resonance imaging apparatus 100 is provided. In response to this timing (t=t0), the energization controller 171B (processor 171; energization controller) starts energizing the superconducting coil 124 with the first current (current A1 in FIG. 6A) less than a rated current in a case of performing the imaging. The entrance of the subject 110 and the start of the energization need not be simultaneously performed. A voltmeter 176 (voltage measurement unit) measures a voltage V, and the information output unit 171E outputs the information indicating the measured voltage to the display 201 (output device) or the like. The measurement and the output are continuously performed until the imaging ends. It should be noted that the first current may be set to, for example, half or less of the rated current, but may be set to a value different from this value depending on the detection accuracy of the magnetic material and other conditions. In addition, the magnitude of the first current may be variable, and the energization controller 171B may apply the first current having a value corresponding to the operation of the user.

FIG. 5B shows a state (time point t=t1 to t2) in which the subject 110 approaches the magnetic resonance imaging apparatus 100, and FIG. 5C shows a state (time point t=t2) in which the subject 110 can move on the top plate 310 and in the imaging space. Since FIGS. 6A and 6B are examples in a case in which the magnetic material does not exist in the imaging space and the vicinity of the imaging space, the voltage V of the superconducting coil 124 does not increase even in a case in which the first current is applied (see FIG. 6B; period of the time points t1 to t2).

In a state in which the subject 110 can move to the imaging space (FIG. 5A; time point t=t2), the voltage V (first voltage) is less than a threshold value, and the temporal change rate of the voltage V is also less than the reference value. Therefore, the energization controller 171B increases the current (period of the time point t=t2 to t3), and energizes the superconducting coil 124 (static magnetic field generation coil) with the rated current (current A2 in FIG. 6A). The examination table movement device 220 slides the top plate 310 to move the subject 110 to the imaging space (state shown in FIG. 5D). As a result, the magnetic resonance image of the subject 110 can be captured. It should be noted that it is preferable that the information output unit 171E outputs the information indicating that the magnetic material does not exist or is not detected (one aspect of the information indicating whether or not the magnetic material exists) to the display 201 or the like before the superconducting coil 124 is energized with the rated current.

Hereinafter, a case will be described in which the magnetic material exists in the imaging space or in the vicinity of the imaging space (for example, the examination room in which the apparatus body 101 is installed or the vicinity of the examination table device 300). Here, the magnetic material is assumed to be an object (for example, a pacemaker, an artificial joint, or the like) owned by the subject 110, but may be an article such as a machine or an instrument used in the vicinity of the magnetic resonance imaging apparatus 100. The magnetic material is a metal such as iron, for example, but a magnetic material other than the metal is also the detection target. In a case in which such a magnetic material exists in the imaging space or in the vicinity of the imaging space, in a case in which the superconducting coil 124 (static magnetic field generation coil) is energized with the first current (time point t=t0 to t1; FIG. 7A), the voltage (first voltage) corresponding to the inductance is generated between the current lead terminals of the superconducting coil 124. The first voltage increases as the subject 110 approaches the magnetic resonance imaging apparatus 100 (that is, as the magnetic material approaches the magnetic resonance imaging apparatus 100) (time points t1 to t4; FIGS. 5A to 5C and FIG. 7B). In the examples shown in FIGS. 7A and 7B, since the first voltage is equal to or larger than a threshold value V0 at the time point t=t4, the magnetic material detection unit 171D can determine that "the magnetic material that affects (causes the problem in) the imaging exists in the imaging space or in the vicinity of the imaging space". In this case, it is preferable that the information output unit 171E outputs the information indicating that the magnetic material exists (one aspect of information indicating whether or not the magnetic material exists) to the display 201 or the like.

The magnetic material detection unit 171D may determine that "the magnetic material is detected" in a case in which at least one of a case in which the first voltage is equal to or larger than the threshold value or a case in which the temporal change rate of the first voltage (change in the first voltage in a period of the time point t=t1 to t4 in the examples of FIGS. 7A and 7B) is equal to or larger than the reference value is satisfied. The magnetic material detection unit 171D (processor 171) can perform one or more of stopping energizing the superconducting coil 124 (static magnetic field generation coil), stopping moving the subject 110 to the imaging space, and giving the notification that the magnetic material is detected, in response to the determination (detection of the magnetic material), and thus it is possible to prevent the imaging from being disturbed due to the existence of the magnetic material. The magnetic material detection unit 171D (processor 171, controller 170) may take a plurality of the above-described countermeasures, or may take all of the above-described countermeasures. The examples shown in FIGS. 7A and 7B show a state in which the first voltage is equal to or larger than the threshold value V0 at the time point t=t4 (FIG. 7B), and a state in which the controller 170 (energization controller) stops energizing the superconducting coil 124 (current is zero at the time point t=t5; FIG. 7A) in response to the state of FIG. 7B.

As described above, in the magnetic resonance imaging apparatus 100, it is preferable to start energizing (applying the first current to) the superconducting coil 124 before the subject 110 is moved to the imaging space, and thus it is possible to promptly take the countermeasure in a case in which the magnetic material is detected.

It should be noted that, in a case in which the condition for the magnitude or the temporal change rate of the first voltage is not satisfied (in a case in which the first voltage is less than the threshold value and the temporal change rate of the first voltage is less than the reference value), the processor 171 (controller 170) can determine that "the magnetic material does not exist" or "the magnetic material exists but does not affect (cause the problem in) the imaging", and can energize the superconducting coil 124 with the rated current to transition to the imaging.

As described above, with the magnetic resonance imaging apparatus 100, the magnetic material existing in the imaging space and the magnetic material existing in the vicinity of the imaging space can be accurately detected with a simple configuration.

Others

In the magnetic resonance imaging apparatus 100 according to the present embodiment, the processor 171 may include, for example, various processors as hardware as follows. The "various processors" include, for example, a central processing unit (CPU) which is a general-purpose processor executing software (program) to function as various processing units, a programmable logic device (PLD), such as a field programmable gate array (FPGA), which is a processor whose circuit configuration can be changed after manufacture, and a dedicated electric circuit, such as an application specific integrated circuit (ASIC), which is a processor having a dedicated circuit configuration designed to perform specific processing.

The processor 171 may be configured by one of these various processors or by two or more processors of the same type or different types (for example, a plurality of FPGAs or a combination of a CPU and an FPGA). Moreover, a plurality of processing units may be configured by one processor. A first example of the configuration in which a plurality of processing units are configured by one processor is a form in which one processor is configured by a combination of one or more CPUs and software, and this processor functions as a plurality of processing units, as represented by a client computer or a server computer. A second example of the configuration is a form in which a processor that implements the functions of the entire system including a plurality of processing units using one integrated circuit (IC) chip is used, as represented by a system on a chip (SoC). As described above, various processing units can be configured by using one or more of the various processors as the hardware structure.

More specifically, the hardware structure of these various processors is an electric circuit (circuitry) obtained by combining circuit elements such as semiconductor elements. It should be noted that, in a case in which the various processors operate, a program or data recorded on a non-transitory and tangible recording medium, such as the ROM 172B, can be referred to, and a recording medium, such as the RAM 172A, can be used as a transitory work area during the operation.

Further, it is needless to say that the present invention is not limited to the above-described embodiments and can be variously modified.

EXPLANATION OF REFERENCES

A1: first current
A2: rated current
V0: threshold value

What is claimed is:

1. A magnetic resonance imaging apparatus that captures a magnetic resonance image of a subject, the magnetic resonance imaging apparatus comprising:

a high-frequency coil;

a gradient magnetic field generation coil;

a static magnetic field generation coil that has an inductance larger than an inductance of the high-frequency coil and an inductance of the gradient magnetic field generation coil, the static magnetic field generation coil being a superconducting coil;

an energization controller that energizes the static magnetic field generation coil, wherein the energization controller is configured to energize the static magnetic field generation coil with a rated current for capturing the magnetic resonance image, and to energize the static magnetic field generation coil with a first current less than the rated current for detecting a magnetic material;

a voltage measurement unit that measures a voltage between current lead terminals of the static magnetic field generation coil; and a magnetic material detection unit that detects the magnetic material existing in an imaging space of the magnetic resonance imaging apparatus and a magnetic material existing in a vicinity of the imaging space based on a first voltage that is a voltage measured in a state in which the static magnetic field generation coil is energized with the first current less than the rated current in a case of capturing the magnetic resonance image.

2. An operation method of a magnetic resonance imaging apparatus that captures a magnetic resonance image of a subject and includes a high-frequency coil, a gradient magnetic field generation coil, a static magnetic field generation coil that has an inductance larger than an inductance of the high-frequency coil and an inductance of the gradient magnetic field generation coil, the static magnetic field generation coil being a superconducting coil, and a processor, the operation method comprising:

via the processor, energizing the static magnetic field generation coil, wherein engineering the static magnetic field generation coil comprises energizing the static magnetic field generation coil with a rated current for capturing the magnetic resonance image and energizing the static magnetic field generation coil with a first current less than the rated current for detecting a magnetic material;

measuring a voltage between current lead terminals of the static magnetic field generation coil; and detecting a magnetic material existing in an imaging space of the magnetic resonance imaging apparatus and the magnetic material existing in a vicinity of the imaging space based on a first voltage that is a voltage measured in a state in which the static magnetic field generation coil is energized with the first current less than the rated current in a case of capturing the magnetic resonance image.

3. The magnetic resonance imaging apparatus according to claim 1, wherein the magnetic material detection unit determines that the magnetic material is detected, in a case in which at least one of a case in which the first voltage is equal to or larger than a threshold value or a case in which a temporal change rate of the first voltage is equal to or larger than a reference value is satisfied.

4. The magnetic resonance imaging apparatus according to claim 1, wherein, in a case in which the magnetic material is detected, the magnetic material detection unit performs one or more of stopping energizing the static magnetic field generation coil, stopping moving the subject to the imaging space, or giving a notification that the magnetic material is detected.

5. The magnetic resonance imaging apparatus according to claim 1, wherein the energization controller starts the energization with the first current before the subject is moved to the imaging space.

6. The magnetic resonance imaging apparatus according to claim 1, further comprising:

an information output unit that outputs information indicating whether or not the magnetic material exists.

7. The magnetic resonance imaging apparatus according to claim 1, further comprising:

an operation unit that receives an operation of instructing the energization controller to perform the energization with the first current.

8. The magnetic resonance imaging apparatus according to claim 1, wherein the magnetic material is a metal.

9. The magnetic resonance imaging apparatus according to claim 3, wherein the energization controller energizes the static magnetic field generation coil with the rated current in a case in which the first voltage is less than the threshold value and the temporal change rate of the first voltage is less than the reference value.

* * * * *